(12) United States Patent
Seyedi et al.

(10) Patent No.: US 10,551,577 B2
(45) Date of Patent: Feb. 4, 2020

(54) LASER ASSEMBLY PACKAGING FOR SILICON PHOTONIC INTERCONNECTS

(71) Applicant: HEWLETT PACKARD ENTERPRISE DEVELOPMENT LP, Houston, TX (US)

(72) Inventors: Ashkan Seyedi, Palo Alto, CA (US); Marco Fiorentino, Palo Alto, CA (US); Geza Kurczveil, Santa Barbara, CA (US); Raymond G. Beausoleil, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/023,596

(22) Filed: Jun. 29, 2018

(65) Prior Publication Data

US 2020/0003971 A1    Jan. 2, 2020

(51) Int. Cl.
*G02B 6/34*    (2006.01)
*G02B 6/42*    (2006.01)
(Continued)

(52) U.S. Cl.
CPC ....... *G02B 6/4232* (2013.01); *G02B 6/12002* (2013.01); *G02B 6/124* (2013.01);
(Continued)

(58) Field of Classification Search
CPC ....... H01S 5/0224; H01S 5/0683; G02B 6/34; G02B 6/4232
See application file for complete search history.

(56) References Cited

U.S. PATENT DOCUMENTS 7,113,526 B2    9/2006    Evans et al.
8,855,452 B2 *   10/2014   Andry ............... G02B 6/4204
                                                                385/33
(Continued)

OTHER PUBLICATIONS

Kopp. C. et al., "Chip-to-chip Optical Interconnections between Stacked Self-Aligned SOI Photonic Chips," (Research Paper), Optics Express, Mar. 2012, vol. 20, No. 7, https://www.researchgate.net/publications/221978445_Chip-to-chip_optical_interconnections between stacked self-aligned SOI photonic chips.

(Continued)

*Primary Examiner* — Michael Carter
(74) *Attorney, Agent, or Firm* — Hewlett Packard Enterprise Patent Department

(57) ABSTRACT

Processes and apparatuses described herein reduce the manufacturing time, the cost of parts, and the cost of assembly per laser for photonic interconnects incorporated into computing systems. An output side of a laser assembly is placed against an input side of a silicon interposer (SiP) such that each pad in a plurality of pads positioned on the output side of the laser assembly is in contact with a respective solder bump that is also in contact with a corresponding pad positioned on the input side of the SiP. The laser assembly is configured to emit laser light from the output side into an input grating of the SiP. The solder bumps are heated to a liquid phase. Capillary forces of the solder bumps realign the laser assembly and the SiP while the solder bumps are in the liquid phase. The solder bumps are then allowed to cool.

20 Claims, 7 Drawing Sheets

(51) Int. Cl.
*G02B 6/32* (2006.01)
*G02B 6/30* (2006.01)
*G02B 6/124* (2006.01)
*G02B 6/12* (2006.01)
*H01S 5/0683* (2006.01)

(52) U.S. Cl.
CPC ............. *G02B 6/30* (2013.01); *G02B 6/32* (2013.01); *G02B 6/34* (2013.01); *G02B 6/4206* (2013.01); *G02B 6/4286* (2013.01); *H01S 5/0683* (2013.01); *G02B 2006/12121* (2013.01); *G02B 2006/12123* (2013.01)

(56) References Cited

U.S. PATENT DOCUMENTS

| | | |
|---|---|---|
| 9,313,562 B2 | 4/2016 | Waldman et al. |
| 9,507,111 B2 * | 11/2016 | Collins ................ G02B 6/34 |
| 9,612,401 B2 | 4/2017 | Frankel et al. |
| 9,798,087 B1 | 10/2017 | Sagi et al. |
| 2003/0006416 A1 * | 1/2003 | Dudoff ................ G02B 6/4204 257/79 |
| 2012/0177381 A1 * | 7/2012 | Dobbelaere ............ H01L 21/84 398/139 |
| 2014/0193115 A1 | 7/2014 | Popovic |
| 2015/0069113 A1 | 3/2015 | Qing et al. |
| 2017/0151416 A1 | 9/2017 | Kobyakov et al. |

OTHER PUBLICATIONS

Extended European Search Report received for EP Patent Application No. 19182992.8, dated Nov. 15, 2019, 9 pages.

* cited by examiner

LASER ASSEMBLY PACKAGING FOR SILICON PHOTONIC INTERCONNECTS

RELATED APPLICATIONS

This application is related to U.S. application Ser. No. 15/953,765, which was filed on Apr. 16, 2018 and is entitled "Comb Laser Arrays for DWDM Interconnects" by Ashkan Seyedi, Marco Fiorentino, Geza Kurczveil, and Raymond G. Beausoleil. The disclosure of U.S. application Ser. No. 15/953,765 is incorporated herein by reference.

BACKGROUND

The term "laser" is an acronym for light amplification by stimulated emission of radiation. Laser light may be generated when the electrons of atoms in certain materials (e.g., crystals, gases, or glasses) absorb energy from an energy source (e.g., an electrical current or another laser). As a result of this energy absorption, the electrons move from a ground state into an excited state. When the electrons return to the ground state, the electrons emit photons of relatively discrete wavelengths.

In fiber optics, laser light can be used as a medium for signal transmission. Fiber optic cables provide high bandwidth, low power loss, resistance to electromagnetic interference, and other qualities that are useful for a wide variety of applications.

BRIEF DESCRIPTION OF THE DRAWINGS

Various features and advantages of the invention will become apparent from the following description of examples of the invention, given by way of example only, which is made with reference to the accompanying drawings, of which.

DETAILED DESCRIPTION

Figure 1:
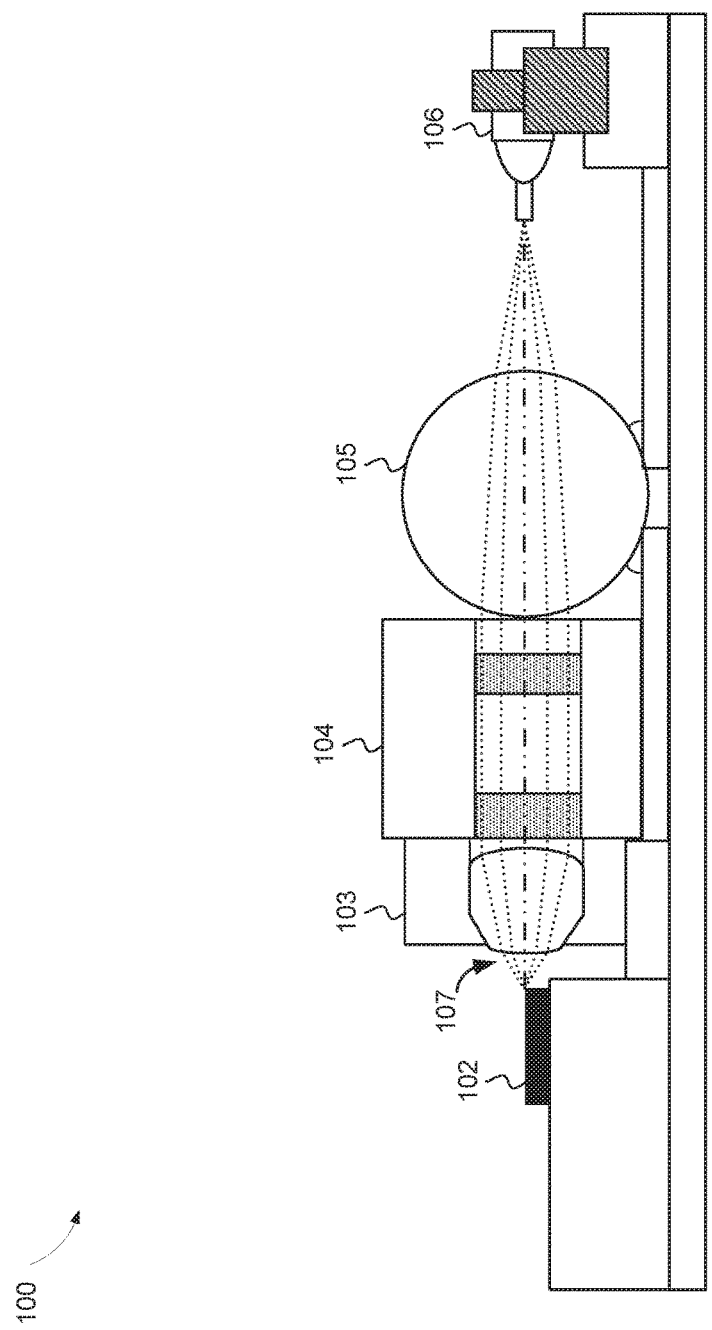
FIG. 1 is a cross-sectional view of an example packaging scheme for a laser diode.

In high-performance computing (HPC) systems, various components (e.g., processors, caches, memory, data stores) communicate with each other to accomplish computational tasks. Frequently, HPC systems are applied to problems that are impractical for standard consumer computers (e.g., desktops and laptops) due to computational complexity, large data sets (e.g., "big data"), hardware limitations, time constraints, and other factors.

Photonic interconnects that use laser light to transmit signals (e.g., through fiber optic cables) have the potential to increase bandwidth, reduce power consumption, and reduce latency for communications between components in HPC systems. However, current schemes for incorporating photonic interconnects into HPC systems face several challenges. For example, current laser packaging schemes for photonic interconnects are expensive. For example, the cost of parts and assembly per laser in current packaging schemes is about 30 U.S. dollars. This price per laser may be prohibitively expensive for an HPC system (which may require hundreds of thousands of lasers).

The high cost of photonic interconnects is due to several factors. First, current packaging schemes typically include components such as collimators, mirrors, barrel isolators, ball lenses, and anti-reflection (AR) coated facets for directing laser light into optic fibers. The cost of these components contributes significantly to the overall cost per laser. Furthermore, AR facets are frequently a point of initial failure for photonic interconnects because the dielectric material used on the AR facets tends to degrade at a molecular level when exposed to the high optical power levels (e.g., greater than 50 milliwatts) of the lasers.

Second, the components in a laser packaging scheme generally have to be aligned very precisely with each other to ensure proper functionality. Robotic pick-and-place tools, if used without additional equipment, may not reliably align the components with sufficient precision. There are visual alignment techniques that can use digital images and fiducial marks printed on the components to help the tools align the components more precisely, but such techniques involve additional hardware (e.g., digital cameras) and additional processing time (e.g., for image analysis). As a result, it may take two minutes or more to package each individual laser. For an HPC system that includes hundreds of thousands of lasers, two minutes per laser may amount to a significant delay. Also, in existing laser packaging schemes, lasers are aligned one at a time. For example, a single robotic arm and a single digital camera generally cannot align multiple lasers simultaneously. To align multiple lasers at the same time, a manufacturer would typically have to have an additional robotic arm and an additional digital camera for each additional laser that is to be aligned in parallel.

The present disclosure describes processes and apparatuses that significantly reduce the cost of incorporating photonic interconnects into HPC systems. Processes described herein provide techniques to align lasers in silicon photonic apparatuses with high sub-micron precision at a relatively low cost without using fiducials or image processing techniques. In addition, processes described herein provide ways for multiple lasers to be aligned simultaneously without requiring separate manufacturing hardware for each laser. The silicon photonic apparatuses assembled by these processes serve as fully functional silicon photonic interconnects, but obviate the need for certain components used in existing interconnects. For example, apparatuses described herein do not require collimators, mirrors, barrel isolators, ball lenses, or anti-reflection (AR) coated facets. As a result, the processes and apparatuses described herein significantly reduce manufacturing time, the cost of parts, and the cost of assembly per laser.

FIG. 1 is a cross-sectional view of an example packaging scheme 100 for a laser diode 102. The laser diode 102 serves as a chip-on-carrier (CoC) for the packaging scheme 100. The dashed lines 107 represent the path of laser light emitted from the laser diode 102.

The packaging scheme 100 includes an aspheric collimator 103, a barrel isolator 104, and a ball lens 105 (e.g., an N-BK7 ball lens with a diameter of 2.5 millimeters) for directing the laser light into a flat cleave fiber optic cable 106.

The packaging scheme 100, once assembled as shown, can convert an electrical signal provided to the laser diode 102 into an optical signal and direct the optical signal (which is represented by laser light) into the flat cleave fiber optic cable 106 for transmission.

While the packaging scheme 100 may be effective for converting an electrical signal into an optical signal on a fiber optic cable, the packaging scheme 100 suffers from the disadvantages discussed above with regard to existing packaging schemes. Specifically, the aspheric collimator 103, the barrel isolator 104, and the ball lens 105 increase the overall cost of parts for the packaging scheme 100. Also, methods for aligning and coupling the components of the packaging scheme 100 may be relatively inefficient (e.g., if image processing techniques are used).

Figure 2:
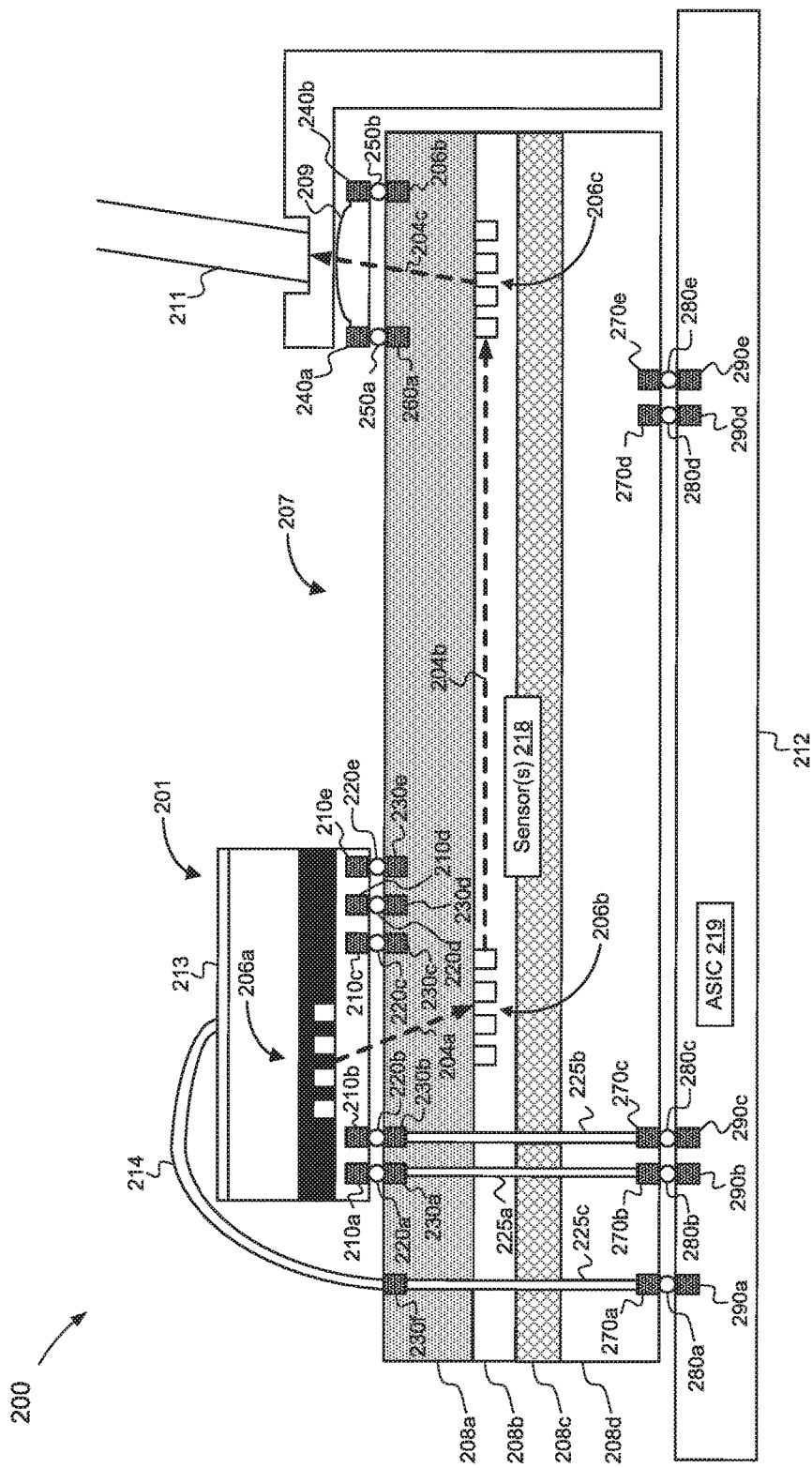
FIG. 2 is a cross-sectional view of a first example packaging scheme for a laser assembly.

FIG. 2 is a cross-sectional view of a first example packaging scheme 200 for a laser assembly 201. The laser assembly 201 comprises a laser diode for generating laser light. Specifically, the laser assembly 201 may comprise a comb laser (e.g., a quantum dot based diode laser operating as an optical frequency comb generator that generates a low-noise multi-spectral output of approximately equidistant spectral lines). In some embodiments, the laser assembly 201 may include multiple laser diodes configured to generate laser light of different spectral bandwidths.

The laser assembly 201 is configured to output laser light in a direction indicated by arrow 204a (the output direction). The side of the laser assembly 201 from which the laser light is emitted is referred to as the output side. In one example, the output direction differs from the direction of the surface normal vector for the output side (e.g., a vector that is orthogonal to the tangent plane to the output side at the point where the laser light exits the laser assembly 201) by twenty degrees or less. In one example, the laser assembly 201 includes a grating-coupled surface-emitting laser (GCSEL) or a vertical-cavity surface-emitting laser (VCSEL) that emits the laser light in the output direction. In particular, if a GCSEL is used, a grating 206a (i.e., the output grating of the laser assembly 201) may be included to redirect the laser light from an initial direction to the output direction.

As shown, metallic pads 210a-e are positioned on the output side of the laser assembly 201. The metallic pads 210a-e are in contact with the solder bumps 220a-e, respectively. As shown, the solder bumps 220a-e are also in contact with the metallic pads 230a-e, respectively, that are positioned on the silicon interposer (SiP) 207. For the purposes of this disclosure, two pads that are in contact with the same solder bump are referred to as "corresponding" pads. For example, pad 230a is the corresponding pad for pad 210a, pad 230b is the corresponding pad for pad 210b, and so forth. While five pairs of corresponding pads are shown, persons of skill in the art will recognize that the number of pairs of corresponding pads can vary. Also, the positions of the pads along the output side of the laser assembly 201 and the corresponding pads on the SiP 207 can vary.

As shown, the SiP 207 may comprise a passivation layer 208a, an optical silicon layer 208b, a buried oxide layer 208c, and a bulk silicon layer 208d. The first silicon layer 208b includes a grating 206b (i.e., the input grating of the SiP) configured to redirect the laser light through the optical silicon layer 208b of the SiP in the direction indicated by the arrow 204b. The SiP 207 may also comprise another grating 206c (i.e., the output grating of the SiP) configured to redirect the laser light in the direction indicated by arrow 204c through the lens 209 for transmission through the fiber optic cable 211. The lens 209 may be part of a lens assembly that includes metallic pads 240a-b. The pads 240a-b are in contact with the solder bumps 250a-b, respectively. As shown, the solder bumps 250a-b are also in contact with the metallic pads 260a-b, respectively, that are positioned on the SiP 207.

The SiP 207 may also include metallic pads 270a-e that are in contact with solder bumps 280a-e, respectively. Solder bumps 280a-e are also in contact with the metallic pads 290a-e, respectively, that are positioned on the substrate 212 (e.g., a circuit board).

Pads 210a-b and the corresponding pads 230a-b couple the laser assembly 201 to the SiP 207, but may also provide portions of circuit paths between the laser assembly 201, the SiP 207, and the substrate 212. Such circuit paths may include through-silicon via (TSV) 225a and TSV 225b, which connect pads 210a-b to pads 280b-c, respectively. For example, pad 210a may be configured to serve as an electrode (e.g., an anode or a cathode) for providing an electrical current to power the laser assembly 201. Specifically, the laser assembly 201 may be configured to route the electrical current through the laser diode included in the laser assembly 201 to generate the laser light.

The electrical current may originate from a power supply connected to the substrate 212. The circuit path for the electrical current may comprise the pad 290b, the solder bump 280b, the pad 270b, the TSV 225a, the pad 230a, the solder bump 220a, and the pad 220a. In addition, the circuit path for the electrical current may comprise the terminal 213 (e.g., which may function as an electrode), the wire 214, the pad 230f, the TSV 225c, the pad 270a, the solder bump 280a, and the pad 290a. In this example, the wire 214 is included because the terminal 213 is not on the output side of the laser assembly 201. However, in other examples, the laser assembly 201 may include both an anode pad and a cathode pad on the output side (e.g., as shown in FIG. 2). In such examples, the terminal 213 and the wire 214 may be omitted.

The SiP 207 may also comprise sensor(s) 218 for measuring quantities associated with the laser light emitted from the laser assembly 201. For example, the sensor(s) 218 may include a photodiode configured to measure the optical output power of the laser assembly 201 and/or a thermal sensor configured to measure a temperature associated with the laser assembly.

The sensor(s) 218 may be configured to communicate sensor readings to an application-specific integrated circuit (ASIC) 219 that is coupled to the substrate 212 (e.g., via a circuit path that extends through the TSV 225b). The ASIC 219 may be configured to determine an adjustment for an operating parameter of the laser assembly 201 based on the sensor readings and communicate the adjustment to the laser assembly 201 (e.g., via a circuit path that extends through the TSV 225b). The operating parameter may by, for example, a power level for the laser diode.

The laser assembly 201 can be coupled to the SiP 207 by a flip-chip process. For example, if the output side of laser assembly 201 is initially facing upward, the solder bumps 220a-e can be heated to a liquid state and deposited on the pads 210a-e. The solder bumps 220a-e are held in place by gravity and allowed to cool to a solid state while the output side faces upward. The laser assembly 201 is then flipped so that the output side faces downward and placed on the SiP 207 such that the solder bumps 220a-e are in contact with the pads 230a-e. The solder bumps 220a-e are then heated to a liquid state again (i.e., in a reflow step). Capillary forces of the solder bumps 220a-e are allowed to fine tune the alignment of the laser assembly 201 with the SiP 207. Once the fine tuning by the capillary forces is complete, the solder bumps 220a-e are allowed to cool to a solid state again. Once cooled, the solder bumps 220a-e couple the laser assembly 201 to the SiP 207. Similar heating, cooling, and reflow actions can be used to couple the SiP 207 to the substrate 212 and the lens assembly (which comprises lens 209 and pads 250a-b). The wire 214 can be soldered to the terminal 213 and to the pad 230f. Note that a process for coupling the laser assembly 201 to the SiP 207 is described in greater detail below in FIG. 6.

Figure 3:
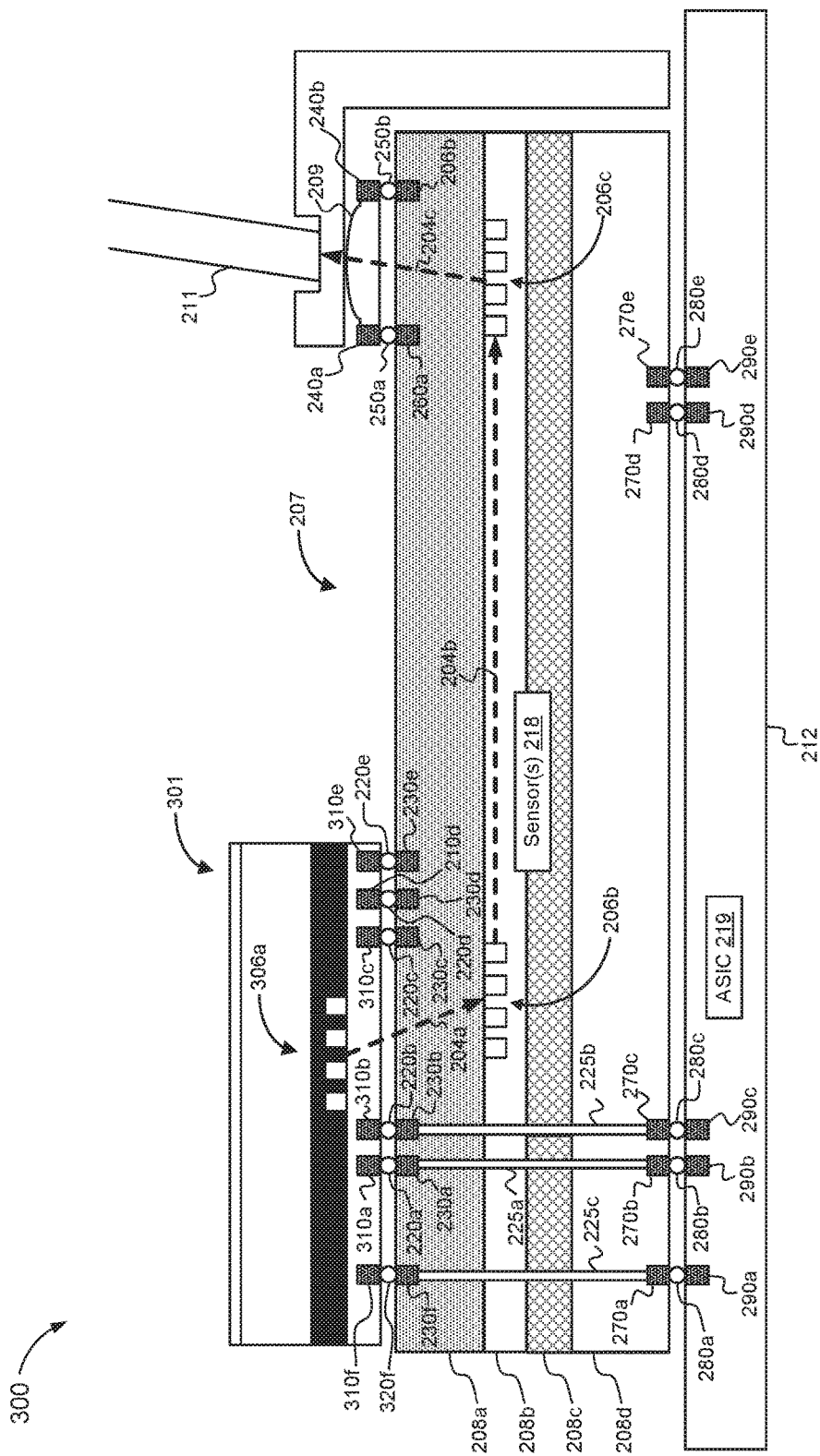
FIG. 3 is a cross-sectional view of a second example packaging scheme for a laser assembly.

FIG. 3 is a cross-sectional view of a second example packaging scheme 300 for a laser assembly 301. Like the laser assembly 201 shown in FIG. 1, the laser assembly 301 comprises one or more laser diodes for generating laser light and is configured to output laser light in the output direction indicated by arrow 204a through the grating 306a. Like pads 210a-e shown in FIG. 1, pads 310a-e are in contact with the solder bumps 220a-e, respectively. The SiP 207, the substrate 212, and the other components shown in FIG. 3 match the descriptions provided above with respect to FIG. 2.

However, unlike laser assembly 201, laser assembly 301 includes an additional pad 310f. The additional pad 310f is in contact with an additional solder bump 320f that is also in contact with the pad 230f. The pad 310f acts as an electrode (e.g., instead of the terminal 213 shown in FIG. 2) circuit path for providing an electrical current to power the laser assembly 301. The circuit path for the electrical current may comprise the pad 290b, the solder bump 280b, the pad 270b, the TSV 225a, the pad 230a, the solder bump 220a, and the pad 320a. In addition, the circuit path for the electrical current may comprise the pad 310f, the solder bump 320f, the pad 230f, the TSV 225c, the pad 270a, the solder bump 280a, and the pad 290a. Since no wire is included in the circuit path, the cost and complexity of attaching a wire bond is avoided.

Figure 4:
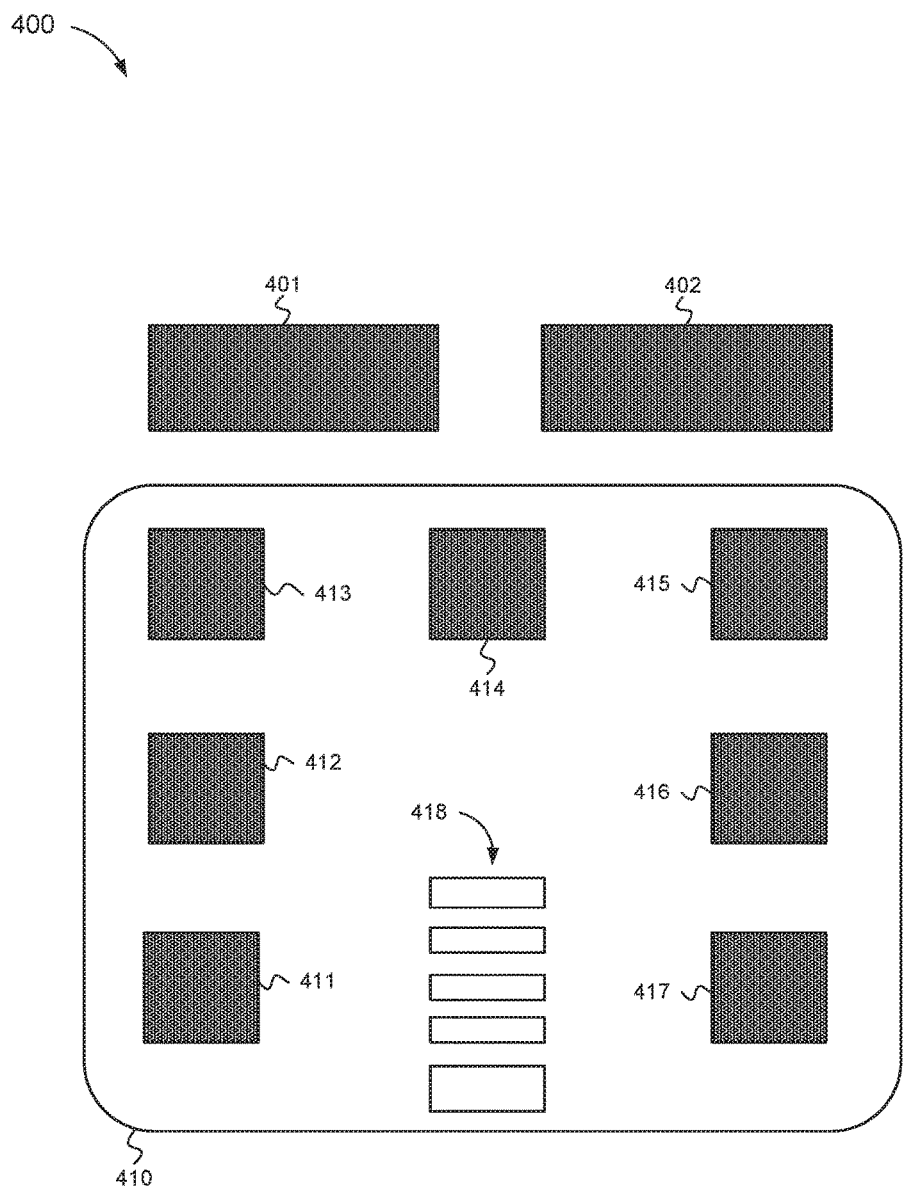
FIG. 4 is a top-down view of an example arrangement of metallic pads for a laser assembly and a SiP, according to one example.

FIG. 4 is a top-down view of an example arrangement 400 of metallic pads for a laser assembly and a SiP, according to one example. Pad 401 and pad 402 are positioned on the input side of a SiP and can be used for attaching wires (e.g., similar to wire 214 shown in FIG. 2) to terminal(s) of a laser assembly. Box 410 represents the footprint of a laser assembly. As shown, pads 411-417 are positioned around the grating 418. Specifically, in this example, the pads 411-417 are positioned on the output side of the laser assembly and are adjacent to three sides of the perimeter of the grating 418. The footprints of the pads 411-417 overlap with the footprints of corresponding pads on the SiP such that solder bumps can be used to couple the pads 411-417 to the corresponding pads. While a total of nine pads are shown, other numbers of pads may be used without departing from the spirit and scope of this disclosure.

Figure 5:
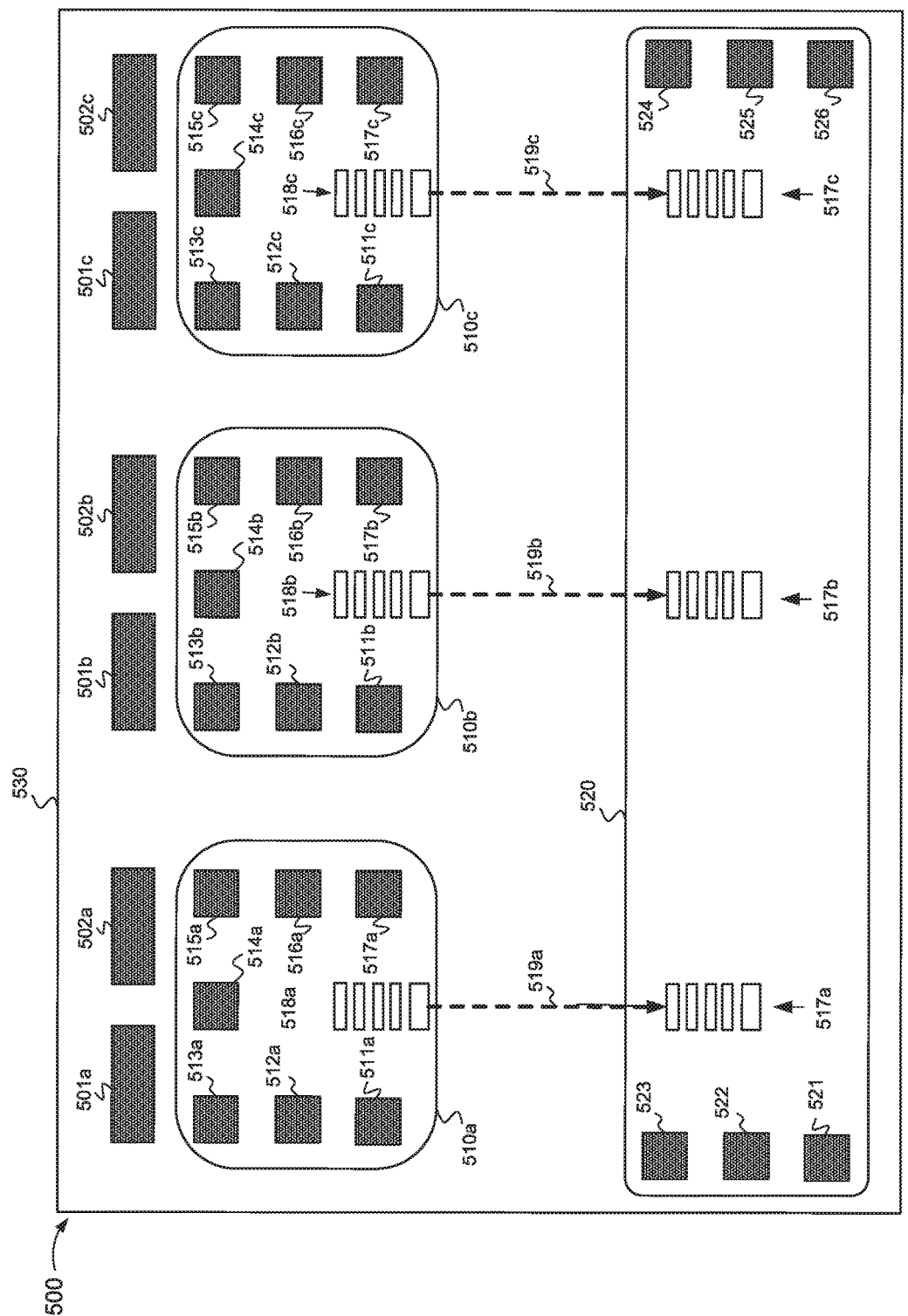
FIG. 5 is a top-down view of an example arrangement of metallic pads for a laser assembly, a SiP, and a lens assembly, according to one example.

FIG. 5 is a top-down view of an example arrangement 500 of metallic pads for a laser assembly, a SiP, and a lens assembly, according to one example. A single laser assembly may comprise multiple laser sub-assemblies; each laser sub assembly may include a laser diode. Boxes 510a-c represent the footprints of three laser sub-assemblies. Pads 501a and 502b are positioned on the input side of the SiP and can be used for attaching wires to terminals of the laser sub-assembly outlined by box 510a. Similarly, pads 501b and 502b are positioned on the input side of the SiP and can be used for attaching wires to terminals of the laser sub-assembly outlined by box 510b. Pads 501c and 502c are positioned on the input side of the SiP and can be used for attaching wires to terminals of the laser sub-assembly outlined by box 510c. Box 530 represents the footprint of the SiP.

As shown, pads 511a-517a are positioned around the grating 518a, pads 511b-517b are positioned around the grating 518b, and pads 511c-517c are positioned around the grating 518c. The footprints of the pads 511a-517a, 511b-517b, and 511c-517c overlap with the footprints of corresponding pads on the SiP such that solder bumps can be used to couple the pads 511a-517a, 511b-517b, and 511c-517c to the corresponding pads.

Box 520 represents the outline of the lens assembly. Pads 521-526 overlap also with the footprints of corresponding pads on the SiP such that solder bumps can be used to couple the pads 521-526 to the corresponding pads. The arrows 519a-c represent the paths of laser light from the gratings 518a-c to the gratings 517a-c. The lens assembly may include lenses mounted over the gratings 517a-c, respectively.

While the arrangement 500 only illustrates footprints of three laser sub-assemblies, more (or less) sub-assemblies may be included in a single laser assembly. A lens assembly may include a lens to receive laser light from each sub-assembly. A single robotic arm can place the laser assembly on the SiP and a single solder reflow step can be used to align the laser assembly (and each sub-assembly included therein) with the SiP. This may reduce manufacturing costs, since multiple lasers can be aligned at once without requiring a separate robotic arm to place each laser individually.

Figure 6:
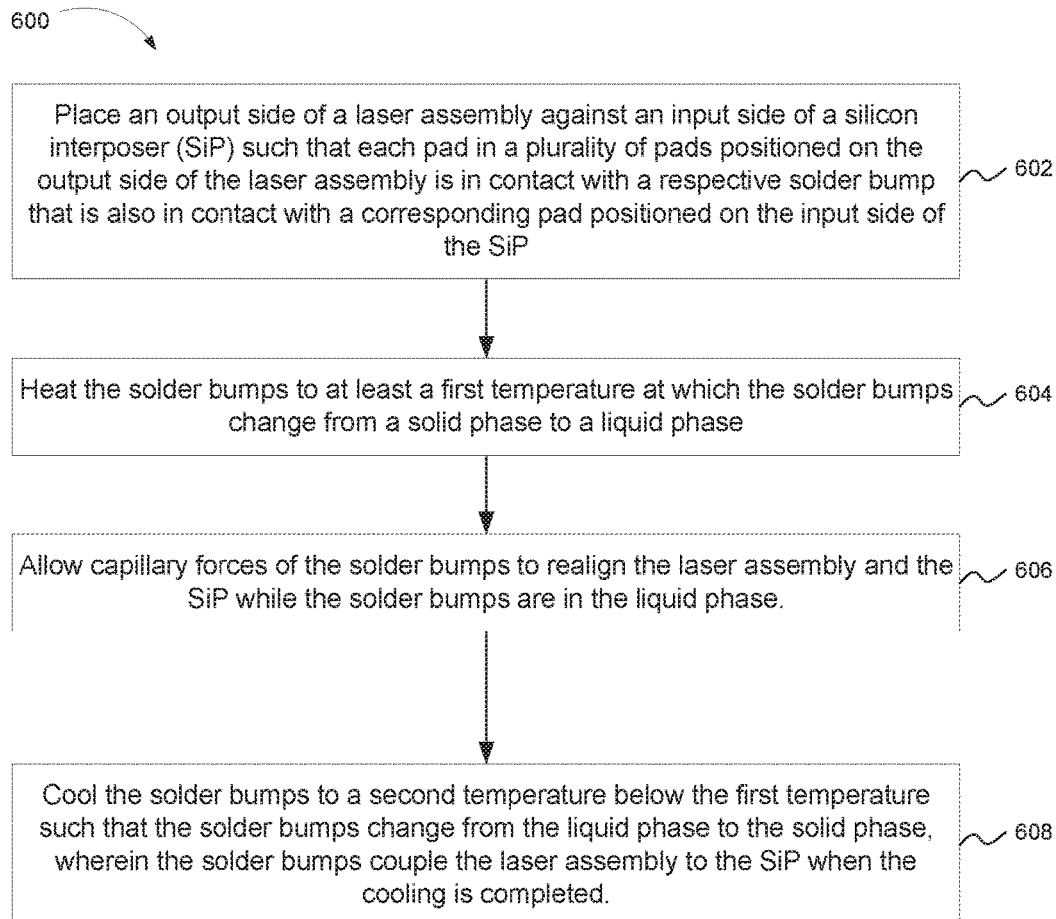
FIG. 6 illustrates an example process for attaching a laser assembly to a Silicon Interposer (SiP).

FIG. 6 illustrates an example process 600 for attaching a laser assembly to a Silicon Interposer (SiP). As shown in block 602, the process 600 may include placing an output side of a laser assembly against an input side of a silicon interposer (SiP) such that each pad in a plurality of pads positioned on the output side of the laser assembly is in contact with a respective solder bump that is also in contact with a corresponding pad positioned on the input side of the SiP. The laser assembly comprises a laser diode and is configured to emit laser light from the output side. The SiP comprises an input grating configured to redirect the laser light through a silicon layer of the SiP.

In some embodiments, the laser assembly may configured to emit the laser light from the output side in an output direction that differs from a direction of a surface normal vector for the output side by twenty degrees or less. The laser assembly may comprise an output grating to direct the laser light in the output direction. For example, if the laser assembly comprises a GCSEL that initially generates the laser light in a direction that differs by the surface normal vector by more than 20 degrees, the output grating may redirect the laser light toward the output direction. The pads positioned on the output side of the laser assembly may be adjacent to at least three edges of a perimeter of the output grating. In another example, the laser assembly may comprise a VCSEL.

The laser diode is configured to generate laser light of at least a first spectral bandwidth. In one example, the laser assembly comprises a comb laser. The laser assembly may also include a second laser diode configured to generate laser light of a second spectral bandwidth.

One of the pads positioned on the output side of the laser assembly may be configured to serve as a first electrode to supply an electrical current to the laser assembly. The laser assembly may be configured to route the electrical current through the laser diode to generate the laser light. A solder bump that is in contact with the pad configured to serve as the first electrode is also in contact with a corresponding pad positioned on the input side of the SiP. The corresponding pad may be in contact with a TSV that passes through the SiP.

In one example, another pad positioned on the output side of the laser assembly may be configured to serve as a second electrode (e.g., that is in contact with another bump that contacts another corresponding pad in contact with another TSV). Specifically, one of the pads positioned on the output side of the laser assembly may be configured to serve as an anode and one of the pads positioned on the output side of the laser assembly may be configured to serve as a cathode to supply the electrical current to the laser assembly.

In another example, the laser assembly further may comprise a terminal positioned on a second side of the laser assembly. The terminal may be configured to serve as a second electrode to supply the electrical current to the laser assembly. The second side and output side may be opposite sides of the laser assembly. In this example, the process 600 may further comprise soldering a first end of a wire to an additional pad positioned on the input side of the SiP. The additional pad may be in contact with a TSV that passes through the SiP. The process 600 may further comprise soldering a second end of the wire to the terminal positioned on the second side of the laser assembly.

The SiP may comprise one or more sensors configured to measure a quantity associated with the laser light. For example, the SiP may comprise a photodiode configured to measure an optical power output of the laser assembly or a thermal sensor (e.g., a thermistor, a resistive temperature device, or an integrated circuit sensor) configured to measure a temperature associated with the laser assembly.

In examples where the SiP comprises a sensor, the process 600 may also include soldering a first end of a first TSV in the SiP to a first terminal of an application-specific integrated circuit (ASIC). A second end of the first TSV may be contact with the sensor. The sensor is configured to communicate sensor readings to the ASIC through the first TSV. The process 600 may also include soldering a first end of a second TSV in the SiP to a second terminal of the ASIC. A second end of the second TSV may be in contact with one of the corresponding pads positioned on the input side of the SiP. The ASIC may be configured to determine an adjustment for an operating parameter of the laser assembly based on the sensor readings and communicate the adjustment to the laser assembly through the second TSV.

As shown in block 604, the process 600 may include heating the solder bumps to at least a first temperature at which the solder bumps change from a solid phase to a liquid phase. While the solder bumps are heated, a force (e.g., the force of gravity) may be applied to the laser assembly in the direction of the surface normal vector to ensure that the solder bumps remain in contact with the pads positioned on the output side of the laser assembly and the pads positioned on the input side of the SiP. The magnitude of the force may be small enough to prevent the solder bumps from being excessively flattened as the solder bumps change to the liquid phase such that the diameters of the solder bumps in the direction of the surface normal vector remain with a predefined range (e.g., 15-100 microns). The magnitude of the force may also be small enough to ensure that a ratio between the diameter of a solder bump in the direction of the surface normal vector (i.e., the minor diameter of the bump) and the diameters of the solder bump in a direction orthogonal to the surface normal vector (i.e., the major diameters of the bump) falls within a predefined range (e.g., 1/2 to 4/5) while the force is applied and the solder bumps is in the liquid phase.

As shown in block 606, the process 600 may include allowing capillary forces of the solder bumps to realign the laser assembly and the SiP while the solder bumps are in the liquid phase. Specifically, the capillary forces of the solder bumps may reduce asymmetry of the solder bumps caused by misalignment of the pads positioned on the output side of the laser assembly with the corresponding pads on the input side of the SiP. As the capillary forces reshape the solder bumps to reduce the asymmetry, the laser assembly and the SiP may be shifted into a more precise alignment with each other than was achieved in the placing in block 602.

As shown in block 608, the process 600 may include cooling the solder bumps to a second temperature below the first temperature such that the solder bumps change from the liquid phase to the solid phase, wherein the solder bumps couple the laser assembly to the SiP when the cooling is completed. A distance between the output grating of the laser assembly and the input grating of the SiP may be less than 100 microns when the cooling is completed. In one example, there is no collimator between the output grating of the laser assembly and the input grating of the SiP, since the distance between them may render collimation unnecessary.

The input grating of the SiP may be configured to redirect the laser light through the silicon layer of the SiP to an output grating of the SiP. The output grating of the SiP may be configured to emit the laser light from the SiP. The process 600 may further comprise placing the SiP against a lens assembly such that each pad in a plurality of pads positioned adjacent to a lens of the lens assembly is in contact with a respective solder bump that is also in contact with a corresponding pad positioned on the SiP adjacent to the output grating of the SiP. The process 600 may also comprise heating the solder bumps that are in contact with the pads positioned adjacent to the lens to at least the first temperature, allowing capillary forces of the solder bumps that are in contact with the pads positioned adjacent to the lens to realign the lens assembly and the SiP while the solder bumps are in the liquid phase, and cooling the solder bumps that are in contact with the pads positioned adjacent to the lens to the second temperature to couple the lens assembly to the SiP.

In some examples, the process 600 may comprise, prior to the placing of the output of the laser assembly against the input side of the SiP described in block 602, depositing the solder bumps onto the pads positioned on the output side of the laser assembly. A temperature of the solder bumps during the deposition may be at least the first temperature (e.g., to ensure that the bumps are in the liquid phase). The solder bumps may also be cooled to at least the second temperature before the placement described in block 602.

Some blocks and actions described with respect to FIG. 6 may be performed in parallel or in different more than one order. For example, the SiP may be coupled to the lens assembly before, during, or after the SiP is coupled to the laser assembly. In addition, additional actions, such as adding an adhesive underfill material to the space between the laser assembly and the SiP may also be performed.

Also, different tools may be used to perform the actions described with respect to FIG. 6. For example, the solder bumps may be heated using a reflow oven, an infrared lamp, or a hot air pencil. The placement described in block 602 may be performed by a pick-and-place robot or by some other agent.

Figure 7:
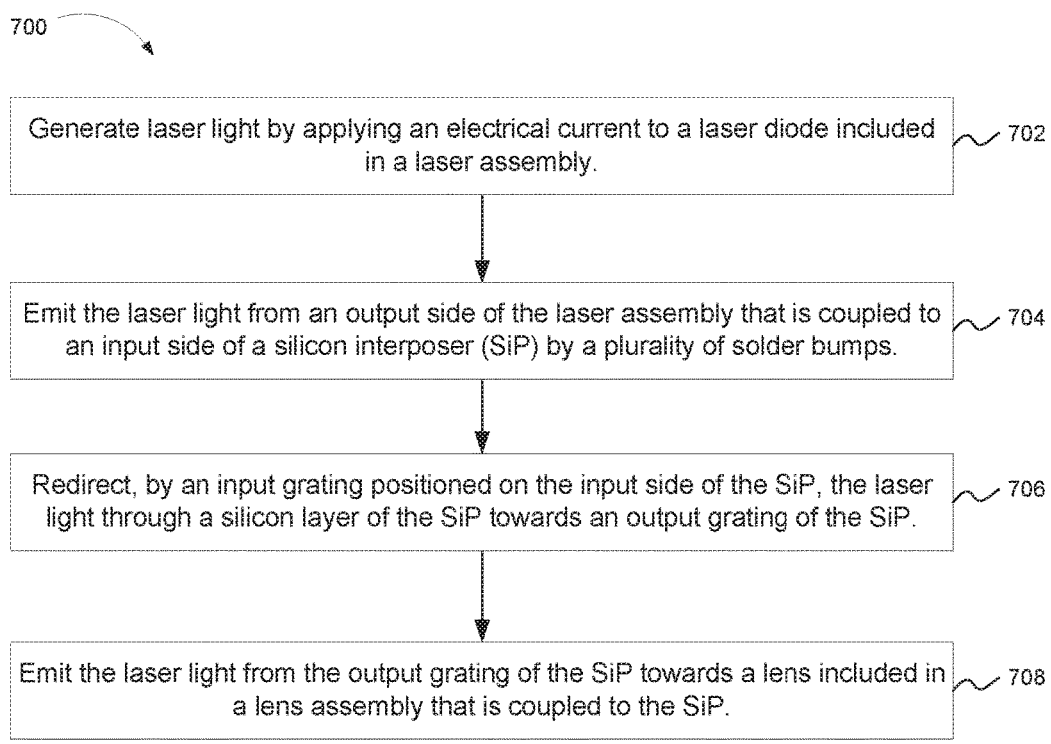
FIG. 7 illustrates an example process for using an apparatus described herein.

FIG. 7 illustrates an example process 700 for using an apparatus described herein. As shown in block 702, the process 700 may include generating laser light by applying an electrical current to a laser diode included in a laser assembly. The laser diose included in the laser assembly may be incorporated in a GCSEL or a VCSEL.

As shown in block 704, the process 700 may include emitting the laser light from an output side of the laser assembly that is coupled to an input side of a silicon interposer (SiP) by a plurality of solder bumps.

Emitting the laser light from the output side of the laser assembly may be accomplished by passing the laser light through an output grating included in the laser assembly to redirect the laser light from an initial direction to an output direction. In one embodiment, the output direction may differ from a direction of a surface normal vector for the output side by twenty degrees or less.

Also, in one example, a distance between the output grating of the laser assembly and the input grating positioned on the input side of the SiP is less than 100 microns. The solder bumps may be attached to pads that are positioned on the input side of the SiP and are adjacent to at least three perimeter edges of the input grating of the SiP. In one example, there is no collimator positioned between the output grating of the laser assembly and the input grating positioned on the input side of the SiP.

As shown in block 706, the process 700 may include redirecting, by an input grating positioned on the input side of the SiP, the laser light through a silicon layer of the SiP towards an output grating of the SiP.

As shown in block 708, the process 700 may include emitting the laser light from the output grating of the SiP towards a lens included in a lens assembly that is coupled to the SiP.

Depending on which specific components are included in the laser assembly and the SiP, the process 700 may also comprise other actions. For example, the process 700 may include measuring, at a sensor incorporated into the SiP, a quantity associated with the laser light. The sensor may be, for example, a photodiode or a thermal sensor (e.g., a thermistor, a resistive temperature device, or an integrated circuit sensor). The quantity associated with the laser light may be, for example, an optical power output of the laser assembly or a temperature.

The process 700 may also include sending, by a first through-silicon via (TSV) in the SiP, one or more sensor readings collected during the measurement to an ASIC. The process 700 may also include determining, at the ASIC based on the sensor readings, an adjustment for an operating parameter of the laser assembly. The ASIC may send, by a second TSV in the SiP, an indication of the adjustment to the laser assembly. Upon receiving the indication, the laser assembly may update the operating parameter in accordance with the adjustment.

There are a number of operating parameters that may be adjusted based on sensor readings (e.g., a power level for the laser diode, a frequency of the laser light, or some other operating parameter). For example, the sensor readings may indicate the temperature of a thermistor sensor located in the SiP. The ASIC, upon receiving the sensor readings, may determine that the temperature exceeds a predefined threshold (e.g., a temperature at which the laser diode is likely to perform poorly or a temperature that is within a threshold number of degrees of a melting point of the solder bumps) or that a rate at which the temperature is increasing exceeds a predefined threshold. Based on such a determination, the ASIC may determine that the power level of the laser diode should be reduced to allow components of the laser assembly or the SiP to cool. The ASIC may signal the laser assembly to reduce the power level for the laser diode accordingly.

EXAMPLES

The following additional examples are included below to highlight several aspects of the apparatus and processes described herein. However, the scope of the disclosure is not limited to these additional examples or the other examples described herein.

Example 1 includes a method comprising: placing an output side of a laser assembly against an input side of a silicon interposer (SiP) such that each pad in a plurality of pads positioned on the output side of the laser assembly is in contact with a respective solder bump that is also in contact with a corresponding pad positioned on the input side of the SiP, wherein the laser assembly comprises a laser diode and is configured to emit laser light from the output side, and wherein the SiP comprises an input grating configured to redirect the laser light through a silicon layer of the SiP; heating the solder bumps to at least a first temperature at which the solder bumps change from a solid phase to a liquid phase; allowing capillary forces of the solder bumps to realign the laser assembly and the SiP while the solder bumps are in the liquid phase; and cooling the solder bumps to a second temperature below the first temperature such that the solder bumps change from the liquid phase to the solid phase, wherein the solder bumps couple the laser assembly to the SiP when the cooling is completed.

Example 2 includes the method of example 1, wherein the laser assembly is configured to emit the laser light from the output side in an output direction that differs from a direction of a surface normal vector for the output side by twenty degrees or less.

Example 3 includes the method of example 1 or 2, wherein the output side of the laser assembly comprises an output grating through which the laser assembly is configured to output the laser light.

Example 4 includes the method of example 3, wherein a distance between the output grating of the laser assembly and the input grating of the SiP is less than 100 microns when the cooling is completed.

Example 5 includes the method of example 1, 2, 3, or 4, wherein the laser assembly comprises a grating-coupled surface-emitting laser (GCSEL) or a vertical-cavity surface-emitting laser (VCSEL).

Example 6 includes the method of example 3, 4, or 5, wherein the pads positioned on the output side of the laser assembly are adjacent to at least three edges of a perimeter of the output grating.

Example 7 includes the method of example 1, 2, 3, 4, 5, or 6, wherein one of the pads positioned on the output side of the laser assembly is configured to serve as a first electrode to supply an electrical current to the laser assembly.

Example 8 includes the method of example 7, wherein a solder bump that is in contact with the pad configured to serve as the first electrode is also in contact with a corresponding pad positioned on the input side of the SiP, and wherein the corresponding pad is in contact with a through-silicon via (TSV) that passes through the SiP.

Example 9 includes he method of example 7, wherein one of the pads positioned on the output side of the laser assembly is configured to serve as an anode and one of the pads positioned on the output side of the laser assembly is configured to serve as a cathode to supply the electrical current to the laser assembly.

Example 10 includes the method of example 7, wherein the laser assembly further comprises a terminal positioned on a second side of the laser assembly, and wherein the terminal is configured to serve as a second electrode to supply the electrical current to the laser assembly.

Example 11 includes the method of example 10, wherein the second side and output side are opposite sides of the laser assembly.

Example 12 includes the method of example 11, further comprising: soldering a first end of a wire to an additional pad positioned on the input side of the SiP, wherein the additional pad is in contact with a through-silicon via (TSV) that passes through the SiP; and soldering a second end of the wire to the terminal positioned on the second side of the laser assembly.

Example 13 includes the method of example 7, 8, 9, 10, or 11, wherein the laser assembly is configured to route the electrical current through the laser diode to generate the laser light.

Example 14 includes the method of example 7, 8, 9, 10, 11, or 12, wherein the SiP comprises at least one sensor configured to measure a quantity associated with the laser light.

Example 15 includes the method of example 14, wherein the at least one sensor comprises a photodiode configured to measure an optical power output of the laser assembly.

Example 16 includes the method of example 14 or 15, wherein the at least one sensor comprises a thermal sensor configured to measure a temperature associated with the laser assembly.

Example 17 includes the method of example 14, 15, or 16, further comprising: soldering a first end of a first through-silicon via (TSV) in the SiP to a first terminal of an application-specific integrated circuit (ASIC), wherein a second end of the first TSV is in contact with the sensor, and wherein the sensor is configured to communicate sensor readings to the ASIC through the first TSV.

Example 18 includes the method of example 17, further comprising: soldering a first end of a second through-silicon via (TSV) in the SiP to a second terminal of the ASIC, wherein a second end of the second TSV is in contact with one of the corresponding pads positioned on the input side of the SiP, and wherein the ASIC is configured to: determine an adjustment for an operating parameter of the laser assembly based on the sensor readings; and communicate the adjustment to the laser assembly through the second TSV.

Example 19 includes the method of example 1, 2, 3, 4, 5, 6, 7, 8, 9, 10, 11, 12, 13, 14, 15, 16, 17, or 18, wherein the input grating of the SiP is configured to redirect the laser light through the silicon layer of the SiP to an output grating of the SiP, and wherein the output grating of the SiP is configured to emit the laser light from the SiP.

Example 20 includes the method of example 19, further comprising: placing the SiP against a lens assembly such that each pad in a plurality of pads positioned adjacent to a lens of the lens assembly is in contact with a respective solder bump that is also in contact with a corresponding pad positioned on the SiP adjacent to the output grating of the SiP; heating the solder bumps that are in contact with the pads positioned adjacent to the lens to at least the first temperature; allowing capillary forces of the solder bumps that are in contact with the pads positioned adjacent to the lens to realign the lens assembly and the SiP while the solder bumps are in the liquid phase; and cooling the solder bumps that are in contact with the pads positioned adjacent to the lens to the second temperature to couple the lens assembly to the SiP.

Example 21 includes the method of example 1, 2, 3, 4, 5, 6, 7, 8, 9, 10, 11, 12, 13, 14, 15, 16, 17, 18, 19, or 20, further comprising: prior to placing the output side of the laser assembly against the input side of the SiP, depositing the solder bumps onto the pads positioned on the output side of the laser assembly, wherein a temperature of the solder bumps during the deposition is at least the first temperature; and prior to placing the output side of the laser assembly against the input side of the SiP, cooling the solder bumps to at least the second temperature.

Example 22 includes the method of example 1, 2, 3, 4, 5, 6, 7, 8, 9, 10, 11, 12, 13, 14, 15, 16, 17, 18, 19, 20, or 21 wherein the laser diode is configured to generate laser light of a first spectral bandwidth, and wherein the laser assembly includes a second laser diode configured to generate laser light of a second spectral bandwidth.

Example 23 includes an apparatus comprising: a laser assembly configured to emit laser light from an output side of the laser assembly; a laser diode included in the laser assembly, wherein the laser diode is configured to generate the laser light; a silicon interposer (SiP), wherein an input side of the SiP is coupled to the output side of the laser assembly by a plurality of solder bumps; an input grating included on the input side of the SiP, wherein the input grating is configured to redirect the laser light through a silicon layer of the SiP.

Example 24 include the apparatus of example 23, further comprising: an output grating included in the SiP, wherein the input grating is configured to redirect the laser light through the silicon layer to the output grating.

Example 25 includes the apparatus of example 24, further comprising: a lens assembly coupled to the SiP by an additional plurality of solder bumps, wherein the output grating is configured to redirect the laser light towards a lens included in the lens assembly.

Example 26 includes the apparatus of example 25, further comprising: a fiber ferrule coupled to the lens assembly.

Example 27 includes the apparatus of example 23, 24, or 25, wherein the laser assembly comprises a grating-coupled surface-emitting laser (GCSEL) or a vertical-cavity surface-emitting laser (VCSEL).

Example 28 includes the apparatus of example 23, 24, or 25, further comprising: a through-silicon via (TSV) that passes through the SiP, wherein a circuit path configured to provide an electrical current to the laser diode includes the TSV and one of the solder bumps.

Example 29 includes the apparatus of example 28, further comprising: a second through-silicon via (TSV) that passes through the SiP, wherein the circuit path includes the second TSV.

Example 30 includes the apparatus of example 28, further comprising: a wire, wherein a first end of the wire is coupled to the second TSV and a second end of the wire is coupled to an electrode positioned on an additional side of the laser assembly, and wherein the circuit path includes the wire and the electrode.

Example 31 includes the apparatus of example 23, 24, 25, 26, 27, 28, 29, or 30, further comprising: a sensor included in the SiP, wherein the sensor is configured to measure a quantity associated with the laser light.

Example 32 includes the apparatus of example 31, wherein the sensor is a photodiode or a thermal sensor.

Example 33 includes the apparatus of example 31 or 32, further comprising: a through-silicon via (TSV) that passes through the SiP and is coupled to the sensor, wherein the sensor is configured to send sensor readings to an application-specific integrated circuit through the TSV.

Example 34 includes the apparatus of example 23, 24, 25, 26, 27, 28, 29, 30, 31, 32, or 33, wherein the solder bumps are in contact with pads positioned on the input side of the SiP, and wherein the pads are adjacent to at least three perimeter edges of the input grating.

Example 35 includes the apparatus of example 23, 24, 25, 26, 27, 28, 29, 30, 31, 32, 33, or 34, wherein the laser diode is configured to generate laser light of a first spectral bandwidth, and wherein the apparatus further comprises: a second laser diode included in the laser assembly, wherein the second laser diode is configured to generate laser light of a second spectral bandwidth.

Example 36 includes the apparatus of example 23, 24, 25, 26, 27, 28, 29, 30, 31, 32, 33, 34, or 35, wherein the output side of the laser assembly comprises an output grating through which the laser assembly is configured to output the laser light, and wherein a distance between the output grating of the laser assembly and the input grating of the SiP is less than 100 microns.

Example 37 includes a method comprising: generating laser light by applying an electrical current to a laser diode included in a laser assembly; emitting the laser light from an output side of the laser assembly, wherein the output side of the laser assembly is coupled to an input side of a silicon interposer (SiP) by a plurality of solder bumps; redirecting, by an input grating positioned on the input side of the SiP, the laser light through a silicon layer of the SiP towards an output grating of the SiP; and emitting the laser light from the output grating of the SiP towards a lens included in a lens assembly that is coupled to the SiP.

Example 38 includes the method of example 37, wherein emitting the laser light from the output side of the laser assembly includes passing the laser light through an output grating included in the laser assembly to redirect the laser light from an initial direction to an output direction.

Example 39 includes the method of example 38, wherein a distance between the output grating of the laser assembly and the input grating positioned on the input side of the SiP is less than 100 microns.

Example 40 includes the method of example 37, 38, or 39, wherein the laser assembly comprises a grating-coupled surface-emitting laser (GCSEL) or a vertical-cavity surface-emitting laser (VCSEL).

Example 41 includes the method of example 37, 38, 39, or 40, wherein the solder bumps are attached to pads that are positioned on the input side of the SiP and are adjacent to at least three perimeter edges of the input grating of the SiP.

Example 42 includes the method of example 37, 38, 39, 40, or 41, further comprising: measuring, at a sensor incorporated into the SiP, a quantity associated with the laser light; sending, by a first through-silicon via (TSV) in the SiP, one or more sensor readings collected during the measurement to an application-specific integrated circuit (ASIC); determining, at the ASIC based on the sensor readings, an adjustment for an operating parameter of the laser assembly; sending, by a second TSV in the SiP, an indication of the adjustment to the laser assembly; and updating the operating parameter at the laser assembly in accordance with the adjustment.

Example 43 includes the method of example 42, wherein the sensor comprises a photodiode and the quantity measures optical power output of the laser assembly.

Example 44 includes the method of example 42, wherein the sensor comprises a thermal sensor and the quantity is a temperature.

Example 45 includes the method of example 1, 2, 3, 4, 5, 6, 7, 8, 9, 10, 11, 12, 13, 14, 15, 16, 17, 18, 19, 20, 21, or 22, wherein there is not a collimator positioned between the output side of the laser assembly and the input grating of the SiP.

Example 46 includes the apparatus of example 23, 24, 25, 26, 27, 28, 29, 30, 31, 32, 33, 34, 35, or 36, wherein there is not a collimator positioned between the output side of the laser assembly and the input grating of the SiP.

Example 47 includes the method of example 37, 38, 39, 40, 41, 42, 43, or 44, wherein there is not a collimator positioned between the output side of the laser assembly and the input grating of the SiP.

Example 48 includes the method of example 1, 2, 3, 4, 5, 6, 7, 8, 9, 10, 11, 12, 13, 14, 15, 16, 17, 18, 19, 20, 21, 22, or 45, wherein neither the laser assembly nor the SiP includes an anti-reflection (AR) coated facet.

Example 49 includes the apparatus of example 23, 24, 25, 26, 27, 28, 29, 30, 31, 32, 33, 34, 35, 36, or 46, wherein the apparatus does not include an anti-reflection (AR) coated facet.

Example 50 includes the method of example 37, 38, 39, 40, 41, 42, 43, 44, or 47, wherein neither the laser assembly nor the SiP includes an anti-reflection (AR) coated facet.

While the apparatuses and processes disclosed herein may be susceptible to various modifications and alternative forms, it is to be understood that the apparatuses and processes are not limited to the particular examples disclosed herein. The present apparatuses and processes include all alternatives, modifications, and equivalents falling within the true spirit and scope of the appended claims.

What is claimed is:

1. A method comprising:
   placing an output side of a laser assembly against an input side of a silicon interposer (SiP) such that each pad in a plurality of pads positioned on the output side of the laser assembly is in contact with a respective solder bump that is also in contact with a corresponding pad positioned on the input side of the SiP, wherein the laser assembly comprises a laser diode and is configured to emit laser light from the output side, and wherein the SiP comprises an input grating configured to redirect the laser light through a silicon layer of the SiP;
   heating the solder bumps to at least a first temperature at which the solder bumps change from a solid phase to a liquid phase;
   allowing capillary forces of the solder bumps to realign the laser assembly and the SiP while the solder bumps are in the liquid phase; and
   cooling the solder bumps to a second temperature below the first temperature such that the solder bumps change from the liquid phase to the solid phase, wherein the solder bumps couple the laser assembly to the SiP when the cooling is completed, wherein the output side of the laser assembly comprises an output grating through which the laser assembly is configured to output the laser light, and wherein a distance between the output grating of the laser assembly and the input grating of the SiP is less than 100 microns when the cooling is completed.

2. The method of claim 1, wherein the laser assembly is configured to emit the laser light from the output side in an output direction that differs from a direction of a surface normal vector for the output side by twenty degrees or less.

3. The method of claim 1, wherein the pads positioned on the output side of the laser assembly are adjacent to at least three edges of a perimeter of the output grating.

4. The method of claim 1, wherein:
   one of the pads positioned on the output side of the laser assembly is configured to serve as a first electrode to supply an electrical current to the laser assembly;

a solder bump that is in contact with the pad configured to serve as the first electrode is also in contact with a corresponding pad positioned on the input side of the SiP; and the corresponding pad is in contact with a through-silicon via (TSV) that passes through the SiP.

5. The method of claim 4, wherein one of the pads positioned on the output side of the laser assembly is configured to serve as an anode and one of the pads positioned on the output side of the laser assembly is configured to serve as a cathode to supply the electrical current to the laser assembly.

6. The method of claim 1, wherein:

one of the pads positioned on the output side of the laser assembly is configured to serve as a first electrode to supply an electrical current to the laser assembly;

the laser assembly further comprises a terminal positioned on a second side of the laser assembly; and the terminal is configured to serve as a second electrode to supply the electrical current to the laser assembly.

7. The method of claim 6, further comprising:

soldering a first end of a wire to an additional pad positioned on the input side of the SiP, wherein the additional pad is in contact with a through-silicon via (TSV) that passes through the SiP; and soldering a second end of the wire to the terminal positioned on the second side of the laser assembly.

8. The method of claim 6, wherein the second side and output side are opposite sides of the laser assembly.

9. The method of claim 1, wherein the SiP comprises at least one sensor configured to measure a quantity associated with the laser light.

10. The method of claim 1, wherein the laser diode is configured to generate laser light of a first spectral bandwidth, and wherein the laser assembly includes a second laser diode configured to generate laser light of a second spectral bandwidth.

11. An apparatus comprising:

a laser assembly configured to emit laser light from an output side of the laser assembly, wherein the output side of the laser assembly comprises an output grating through which the laser assembly is configured to output the laser light;

a laser diode included in the laser assembly, wherein the laser diode is configured to generate the laser light;

a silicon interposer (SiP), wherein an input side of the SiP is coupled to the output side of the laser assembly by a plurality of solder bumps;

an input grating included on the input side of the SiP, wherein the input grating is configured to redirect the laser light through a silicon layer of the SiP, wherein a distance between the output grating and the input grating of the SiP is less than 100 microns.

12. The apparatus of claim 11, wherein the input grating is configured to redirect the laser light through the silicon layer to the output grating, and wherein the apparatus further comprises:

a lens assembly coupled to the SiP by an additional plurality of solder bumps, wherein the output grating is configured to redirect the laser light towards a lens included in the lens assembly.

13. The apparatus of claim 11, wherein the laser assembly comprises a grating-coupled surface-emitting laser (GC-SEL) or a vertical-cavity surface-emitting laser (VCSEL).

14. The apparatus of claim 11, further comprising:

a through-silicon via (TSV) that passes through the SiP, wherein a circuit path configured to provide an electrical current to the laser diode includes the TSV and one of the solder bumps.

15. The apparatus of claim 14, further comprising:

a wire, wherein a first end of the wire is coupled to the second TSV and a second end of the wire is coupled to an electrode positioned on an additional side of the laser assembly, and wherein the circuit path includes the wire and the electrode.

16. The apparatus of claim 11, further comprising:

a sensor included in the SiP, wherein the sensor is configured to measure a quantity associated with the laser light.

17. The apparatus of claim 16, further comprising:

a through-silicon via (TSV) that passes through the SiP and is coupled to the sensor, wherein the sensor is configured to send sensor readings to an application-specific integrated circuit through the TSV.

18. The apparatus of claim 11, wherein the laser diode is configured to generate laser light of a first spectral bandwidth, and wherein the apparatus further comprises:

a second laser diode included in the laser assembly, wherein the second laser diode is configured to generate laser light of a second spectral bandwidth.

19. A method comprising:

generating laser light by applying an electrical current to a laser diode included in a laser assembly;

emitting the laser light from an output side of the laser assembly, wherein the output side of the laser assembly is coupled to an input side of a silicon interposer (SiP) by a plurality of solder bumps;

redirecting, by an input grating positioned on the input side of the SiP, the laser light through a silicon layer of the SiP towards an output grating of the SiP;

emitting the laser light from the output grating of the SiP towards a lens included in a lens assembly that is coupled to the SiP;

measuring, at a sensor incorporated into the SiP, a quantity associated with the laser light;

sending, through a first through-silicon via (TSV) in the SiP, one or more sensor readings collected during the measurement to an application-specific integrated circuit (ASIC);

determining, at the ASIC based on the sensor readings, an adjustment for an operating parameter of the laser assembly;

sending, through a second TSV in the SiP, an indication of the adjustment to the laser assembly; and updating the operating parameter at the laser assembly in accordance with the adjustment.

20. The method of claim 19, wherein the sensor comprises:

a photodiode configured to measure an optical power output of the laser assembly; or a thermal sensor configured to measure a temperature associated with the laser assembly.

* * * * *